US010692951B2

(12) United States Patent
Song et al.

(10) Patent No.: US 10,692,951 B2
(45) Date of Patent: Jun. 23, 2020

(54) BACK PLATE AND MANUFACTURING METHOD THEREOF

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/969,089

(22) Filed: May 2, 2018

(65) Prior Publication Data

US 2019/0067403 A1 Feb. 28, 2019

(30) Foreign Application Priority Data

Aug. 24, 2017 (CN) .......................... 2017 1 0736837

(51) Int. Cl.
*H01L 27/32* (2006.01)
*H01L 27/12* (2006.01)
*H01L 29/417* (2006.01)
*H01L 29/786* (2006.01)

(52) U.S. Cl.
CPC ...... *H01L 27/3272* (2013.01); *H01L 27/1255* (2013.01); *H01L 27/3262* (2013.01); *H01L 29/41733* (2013.01); *H01L 29/78633* (2013.01); *H01L 2227/323* (2013.01)

(58) Field of Classification Search
CPC ........... H01L 2227/323; H01L 27/3244; H01L 27/3272; H01L 27/3262; H01L 27/1255; H01L 29/41733; H01L 29/78633
See application file for complete search history.

(56) References Cited

U.S. PATENT DOCUMENTS

| 10,388,710 B2* | 8/2019 | Lee ...................... H01L 27/3272 |
| 2016/0035811 A1 | 2/2016 | Choi et al. |
| 2016/0378224 A1* | 12/2016 | Kwon ................. H01L 51/5256 |
| | | 345/174 |
| 2017/0250207 A1 | 8/2017 | Wang et al. |

FOREIGN PATENT DOCUMENTS

| CN | 104900532 A | 9/2015 |
| CN | 105321986 A | 2/2016 |
| CN | 106876327 A | 6/2017 |
| KR | 20070040128 A | 4/2007 |

OTHER PUBLICATIONS

First Office Action for Chinese Application No. 201710736837.6, dated Jun. 28, 2019, 6 pages.

* cited by examiner

*Primary Examiner* — Jasmine J Clark
(74) *Attorney, Agent, or Firm* — Brooks Kushman P.C.

(57) ABSTRACT

The present disclosure provides in some embodiments a back plate and a manufacturing method thereof. The back plate includes a base substrate and a driving TFT arranged on the base substrate. The driving transistor includes a light-shielding layer, a buffer layer and an active layer arranged sequentially on the base substrate. A gate insulation layer, a gate electrode, a source electrode, a drain electrode and an interlayer dielectric layer are arranged on the active layer. The buffer layer is provided with a first protrusion, and an orthogonal projection of the first protrusion onto the base substrate is located within an orthogonal projection of the gate electrode onto the base substrate.

13 Claims, 13 Drawing Sheets

BACK PLATE AND MANUFACTURING METHOD THEREOF

CROSS-REFERENCE TO RELATED APPLICATION

This application claims priority to Chinese Patent Application No. 201710736837.6 filed on Aug. 24, 2017, which is incorporated herein by reference in its entirety.

TECHNICAL FIELD

The present disclosure relates to the field of display technology, in particular to a back plate and a manufacturing method thereof.

BACKGROUND

For an organic light-emitting diode (OLED) display panel, usually a back plate including a driving thin film transistor (TFT) with a top-gate structure is adopted. In the case that a light beam from an OLED reaches an active layer of the driving TFT, drift may occur for a threshold voltage of the driving TFT. Hence, a property of the driving TFT may change significantly and thereby a display effect of the OLED display panel may be adversely affected.

SUMMARY

In one aspect, the present disclosure provides in some embodiments a back plate including a base substrate and a driving TFT arranged on the base substrate. The driving TFT includes a light-shielding layer, a buffer layer and an active layer arranged sequentially on the base substrate. A gate insulation layer, a gate electrode, a source electrode, a drain electrode and an interlayer dielectric layer are arranged on the active layer. The buffer layer is provided with a first protrusion, and an orthogonal projection of the first protrusion onto the base substrate is located within an orthogonal projection of the gate electrode onto the base substrate.

In a possible embodiment of the present disclosure, the light-shielding layer is arranged on the buffer layer, and the active layer is arranged on the buffer layer and the light-shielding layer. The active layer includes a semiconductor region, and a first conductor region and a second conductor region arranged at two sides of the semiconductor region respectively. Each of the first conductor region and the second conductor region is acquired by subjecting a semiconductor to conductive treatment. The light-shielding layer has a resistance smaller than the first conductor region. The first conductor region is connected to the source electrode, the second conductor region is connected to the drain electrode, and the semiconductor region, the first conductor region and the source electrode are connected to the light-shielding layer.

In a possible embodiment of the present disclosure, the orthogonal projection of the gate electrode onto the base substrate overlaps an orthogonal projection of the light-shielding layer onto the base substrate.

In a possible embodiment of the present disclosure, a first via-hole and a second via-hole are formed in the interlayer dielectric layer. The source electrode is connected to the light-shielding layer and the first conductor region through the first via-hole, and a lower part of the first via-hole is defined by the light-shielding layer and the first conductor region. The drain electrode is connected to the second conductor region through the second via-hole.

In a possible embodiment of the present disclosure, the light-shielding layer includes a first thickness region, a second thickness region and a thickness third region arranged sequentially in a descending order of thicknesses. A distance between the base substrate and a surface of the first thickness region away from the base substrate is equal to a distance between the base substrate and a surface of the first protrusion away from the base substrate. The source electrode is connected to the first thickness region. The buffer layer is further provided with a second protrusion, and a distance between the base substrate and a surface of the second protrusion away from the base substrate is equal to the distance between the base substrate and the surface of the first protrusion away from the base substrate. The drain electrode is connected to a portion of the second conductor region arranged on the second protrusion.

In a possible embodiment of the present disclosure, the active layer is made of one or more amorphous indium gallium zinc oxide, zinc oxynitride, indium zinc tin oxide, amorphous silicon, poly-silicon, sexithiophene and polythiophene.

In a possible embodiment of the present disclosure, the back plate further includes a switching TFT and an OLED arranged on the base substrate. The driving TFT is connected to the OLED and the switching TFT, and the OLED is capable of emitting a light beam toward the base substrate.

In another aspect, the present disclosure provides in some embodiments a method for manufacturing a back plate, including a step of forming a driving TFT on a base substrate. The driving transistor includes a light-shielding layer, a buffer layer and an active layer arranged sequentially on the base substrate. A gate insulation layer, a gate electrode, a source electrode, a drain electrode and an interlayer dielectric layer are arranged on the active layer. The buffer layer is provided with a first protrusion, and an orthogonal projection of the first protrusion onto the base substrate is located within an orthogonal projection of the gate electrode onto the base substrate.

In a possible embodiment of the present disclosure, the step of forming the driving TFT on the base substrate includes: forming the light-shielding layer and the buffer layer on the base substrate, the buffer layer being arranged on the light-shielding layer; forming the active layer, the gate insulation layer and the gate electrode on the buffer layer and the light-shielding layer, the active layer being arranged on the buffer layer and the light-shielding layer and including a semiconductor region and a first conductor region and a second conductor region arranged at two sides of the semiconductor region respectively, the semiconductor region and the first conductor region being connected to the light-shielding layer, each of the first conductor region and the second conductor region being acquired by subjecting a semiconductor to conductive treatment, the light-shielding layer having a resistance smaller than the first conductor region; forming the interlayer dielectric layer on the base substrate with the gate electrode; and forming the source electrode and the drain electrode on the interlayer dielectric layer, the source electrode being connected to the first conductor region and the light-shielding layer, and the drain electrode being connected to the second conductor region.

In a possible embodiment of the present disclosure, the step of forming the active layer, the gate insulation layer and the gate electrode on the buffer layer and the light-shielding layer includes: forming a semiconductor pattern on the buffer layer and the light-shielding layer; forming a gate insulation material layer and a gate metal layer sequentially on the base substrate with the semiconductor pattern; forming a first photoresist pattern on the gate metal layer; etching the gate metal layer and the gate insulation material layer through the first photoresist pattern, so as to acquire the gate electrode and the gate insulation layer, the orthogonal projection of the gate electrode onto the base substrate overlapping an orthogonal projection of the light-shielding layer onto the base substrate; subjecting two end portions of the semiconductor patterns to conductive treatment, so as to acquire the active layer; and removing the first photoresist pattern.

In a possible embodiment of the present disclosure, the step of forming the interlayer dielectric layer on the base substrate with the gate electrode includes: forming a dielectric material layer on the base substrate with the gate electrode; and forming a first via-hole and a second via-hole in the dielectric material layer so as to acquire the interlayer dielectric layer. The source electrode is connected to the light-shielding layer and the first conductor region through the first via-hole, and a lower part of the first via-hole is defined by the light-shielding layer and the first conductor region. The drain electrode is connected to the second conductor region through the second via-hole.

In a possible embodiment of the present disclosure, the step of forming the light-shielding layer and the buffer layer on the base substrate includes: forming a first light-shielding conductive material layer on the base substrate; forming a second photoresist pattern on the base substrate with the first light-shielding conductive material layer; subjecting a first region of the first light-shielding conductive material layer not covered by the second photoresist pattern to oxidation treatment through the second photoresist pattern, so as to acquire a buffer material layer and a second light-shielding conductive material layer, the buffer material layer including a first portion of the first region that has been oxidized, the second light-shielding conductive material layer including a second portion of the first region that has not been oxidized and a second region of the first light-shielding conductive material layer covered by the second photoresist pattern, the first portion covering the second portion, and the second portion being connected to the second region; removing the second photoresist pattern; forming a third photoresist pattern on the buffer material layer and the second light-shielding conductive material layer; etching the buffer material layer through the third photoresist pattern so as to acquire the buffer layer, the buffer layer being further provided with a second protrusion, a distance between the base substrate and a surface of the second protrusion away from the base substrate being equal to a distance between the base substrate and a surface of the first protrusion away from the base substrate, the drain electrode being connected to a portion of the second conductor region on the second protrusion; etching the second region of the second light-shielding conductive material layer through the third photoresist pattern so as to acquire the light-shielding layer, the light-shielding layer including a first thickness region, a second thickness region and a third thickness region arranged sequentially in a descending order of thicknesses, a distance between the base substrate and a surface of the first thickness region away from the base substrate being equal to the distance between the base substrate and the surface of the first protrusion away from the base substrate, the source electrode being connected to the first thickness region; and removing the third photoresist pattern.

In a possible embodiment of the present disclosure, the manufacture method further includes: forming a switching TFT on the base substrate; and forming an OLED on the driving TFT. The driving TFT is connected to the OLED and the switching TFT, and the OLED is capable of emitting a light beam toward the base substrate.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

The drawings are provided to facilitate the understanding of the present disclosure, and constitute a portion of the description. These drawings and the following embodiments are for illustrative purposes only, but shall not be construed as limiting the present disclosure.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
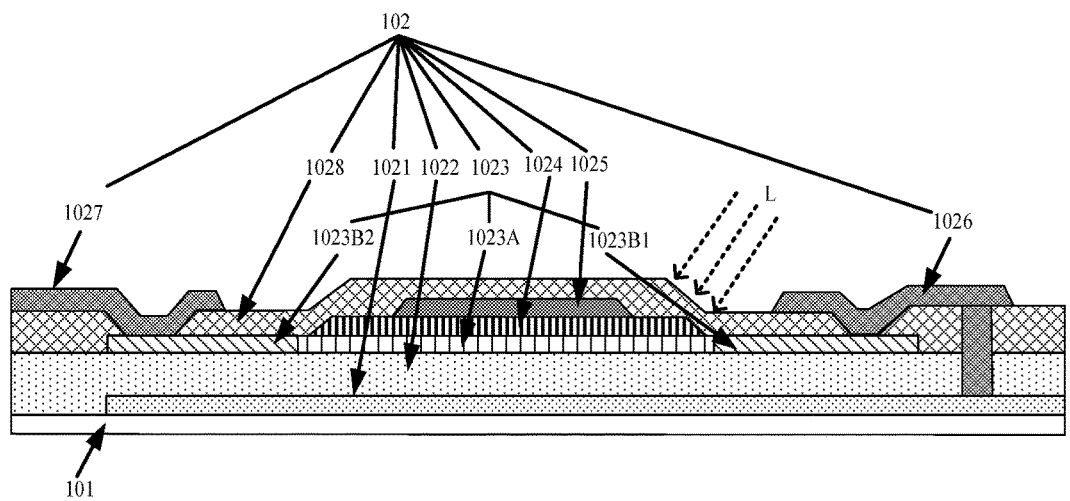
FIG. 1 is a schematic view showing a back plate.

As shown in FIG. 1, a back plate including a driving TFT with a top-gate structure includes: a base substrate 101, and a switching TFT, a driving TFT 102 and an OLED arranged sequentially on the base substrate. The driving TFT 102 is connected to the switching TFT and the OLED, and the OLED is capable of emitting a light beam toward the base substrate. In a possible embodiment of the present disclosure, the driving TFT includes a light-shielding layer 1021, a buffer layer 1022 and an active layer 1023 arranged on the base substrate 101. A gate insulation layer 1024 and a gate electrode 1025 are arranged on the active layer 1023. A source electrode 1026 and a drain electrode 1027 are arranged at two sides of the gate insulation layer 1024 or the gate electrode 1025 respectively. An interlayer dielectric (ILD) layer 1028 is arranged on the gate insulation layer 1024, the gate electrode 1025 and the active layer 1023. Each of the ILD layer 1028 and the gate insulation layer 1024 is made of a transparent material, and the gate electrode 1025 is made of a nontransparent material. Usually, the gate electrode 1025 is a surface-like electrode, and an orthogonal projection of the gate electrode 1025 onto the active layer 1023 is relatively small, so that a portion of the active layer is merely shielded by the gate electrode 1025. In the case that the light beam L is emitted by the OLED toward the base substrate 101, a part of the light beam L is capable of passing through the ILD layer 1028 at two sides of the gate electrode 1025 and entering the active layer 1023.

In the related art, in the case that the light beam L from the OLED reaches the active layer, drift may occur for a threshold voltage of the driving TFT. Hence, a property of the driving TFT may change significantly and thereby a display effect of an OLED display panel may be adversely affected.

Figure 2:
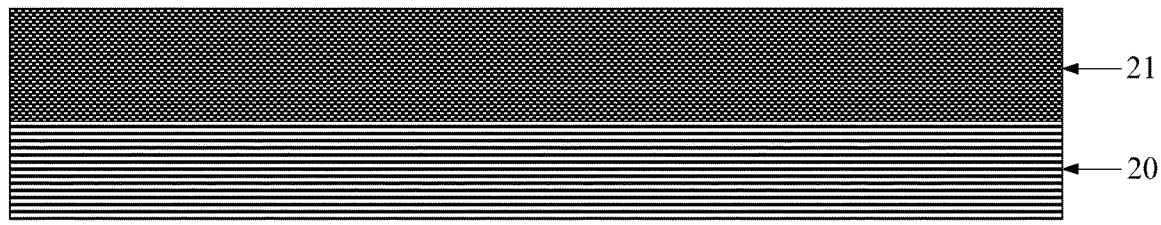
FIG. 2 is a schematic view showing an application scenario of a back plate according to one embodiment of the present disclosure.

As shown in FIG. 2 which is a schematic view showing an application scenario of a back plate according to one embodiment of the present disclosure, the back plate 20 is arranged opposite to a cover plate 21. The back plate 20 includes a base substrate, a switching TFT, a driving TFT and an OLED. The driving TFT and the OLED may be arranged between the base substrate and the cover plate 21. The back plate 20 and the cover plate 21 may form an OLED display panel.

Figure 3:
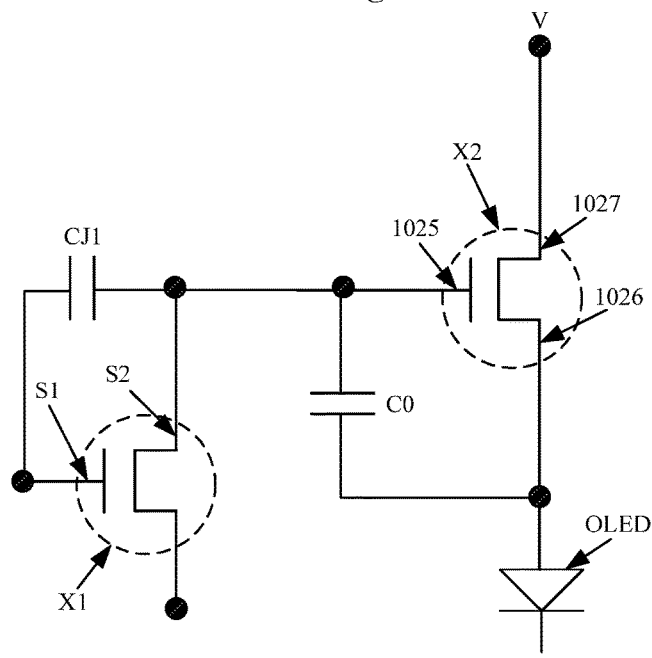
FIG. 3 is a schematic view showing a connection relationship among a switching TFT, a driving TFT and an OLED according to one embodiment of the present disclosure.

As shown in FIG. 3 which is a schematic view showing a connection relationship among the switching TFT, the driving TFT and the OLED, a source electrode S2 of the switching TFT X1 is connected to a gate electrode 1025 of the driving TFT X2, a drain electrode 1027 of the driving TFT X2 is connected to a data voltage input end V, and a source electrode 1026 of the driving TFT X2 is connected to the OLED. In addition, a pixel capacitor CO is arranged between the gate electrode 1025 and the source electrode 1026 of the driving TFT X2. A parasitic capacitor CJ1 is formed between a gate electrode S1 and a source electrode S22 of the switching TFT X1.

In the case that an on-state voltage is inputted from the source electrode S2 of the switching TFT X1 to the gate electrode 1025 of the driving TFT X2, the drain electrode 1027 of the driving TFT X2 is electrically connected to the source electrode 1026 thereof. At this time, a data voltage may be applied by the data voltage input end V to the source electrode 1026 of the driving TFT X2 through the drain electrode 1027 of the driving TFT X2, so as to charge the pixel capacitor CO. In the case that a light beam needs to be emitted by the OLED, the pixel capacitor CO is discharged toward the OLED, so as to drive the OLED to emit the light beam. In the case that an off-state voltage is inputted from the source electrode 1026 of the switching TFT X1 to the gate electrode 1025 of the driving TFT X2, the driving TFT X2 is turned off, and the drain electrode 1027 of the driving TFT X2 is electrically disconnected from the source electrode 1026 thereof. At this time, it is impossible for the data voltage input end V to apply the data voltage to the source electrode 1026 of the driving TFT X2 through the drain electrode 1027 of the driving TFT X2.

Figure 4:
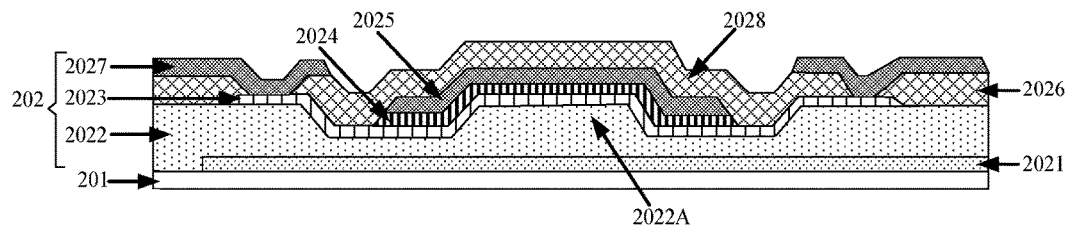
FIG. 4 is a schematic view showing the back plate according to one embodiment of the present disclosure.

FIG. 4 is a schematic view showing the back plate according to one embodiment of the present disclosure, where the back plate may be that in FIG. 2, and the connection relationship among the switching TFT, the driving TFT and the OLED may be similar to that shown in FIG. 3. As shown in FIG. 4, the back plate may include a base substrate 201, and a driving TFT 202, an OLED and a switching TFT arranged sequentially on the base substrate 201. The driving TFT 202 is connected to the OLED and the switching TFT, and the OLED is capable of emitting a light beam toward the base substrate 201.

The driving TFT 202 may include a light-shielding layer 2021, a buffer layer 2022 and an active layer 2023 arranged sequentially on the base substrate 201. A gate insulation layer 2024, a gate electrode 2025, a source electrode 2026, a drain electrode 2027 and an interlayer dielectric layer 2028 are arranged on the active layer 2023. The buffer layer 2022 is provided with a first protrusion 2022A, and an orthogonal projection of the first protrusion 2022A onto the base substrate 201 is located within an orthogonal projection of the gate electrode 2025 onto the base substrate 201.

According to the back plate in the embodiments of the present disclosure, due to the first protrusion of the buffer layer, two lateral portions of the gate electrode and two lateral portions of the active layer are curved toward the base substrate, so as to enable the gate electrode in a curved state to shield the active layer and prevent the light beam from entering the active layer from the two sides of the gate electrode, thereby to improve negative bias temperature illumination stability (NBTIS) of the driving TFT, and ensure a display effect of an OLED display panel.

Figure 5:
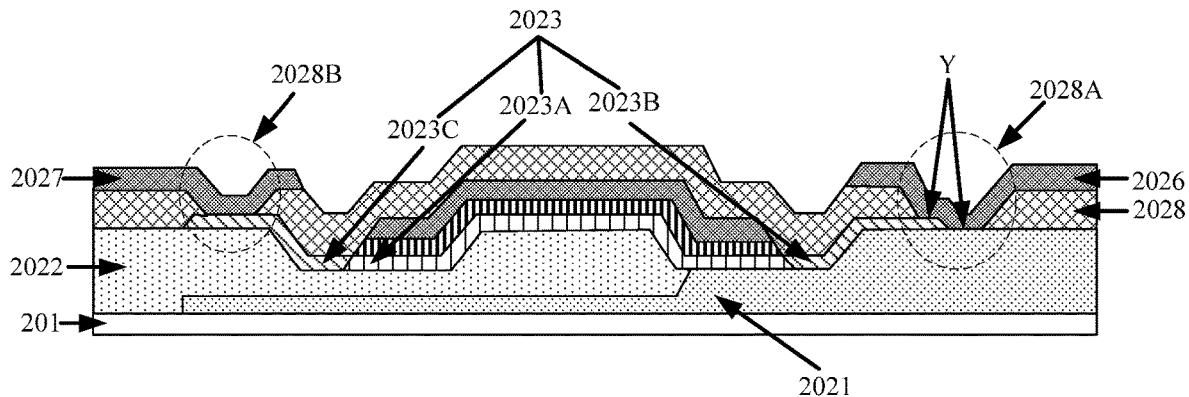
FIG. 5 is another schematic view showing the back plate according to one embodiment of the present disclosure.

In a possible embodiment of the present disclosure, as shown in FIG. 5, the buffer layer 2022 is arranged on the light-shielding layer 2021, and the active layer 2023 is arranged on the buffer layer 2022 and the light-shielding layer 2021. It should be appreciated that, the buffer layer 2022 is acquired by subjecting a light-shielding conductive material into oxygen plasma treatment, oxygen-based high-temperature annealing treatment or anode oxidation treatment. The light-shielding layer 2021 may be made of a light-shielding conductive material.

As shown in FIG. 5, the active layer 2023 includes a semiconductor region 2023A, and a first conductor region 2023B and a second conductor region 2023C arranged at two sides of the semiconductor region 2023A respectively. The first conductor region 2023B is connected to the source electrode 2026, the second conductor region 2023C is connected to the drain electrode 2027, and the semiconductor region 2023A, the first conductor region 2023B and the source electrode 2026 are connected to the light-shielding layer 2021. Each of the first conductor region 2023B and the second conductor region 2023C is acquired by subjecting a semiconductor to conductive treatment. The light-shielding layer 2021 has a resistance smaller than the first conductor region 2023B. It should be appreciated that, the semiconductor may be subjected to the conductive treatment through ion injection or hydrogenation (i.e., placing the semiconductor in a hydrogen environment).

For the driving TFT in FIG. 1, the drain electrode 1027 is connected to the source electrode 1026 through the active layer 1023, the active layer 1023 includes a semiconductor region 1023A and a first conductor region 1023B1 and a second conductor region 1023B2 arranged at two sides of the semiconductor region 1023A, and each of the first conductor region 1023B1 and the second conductor region 1023B2 is acquired by subjecting a semiconductor to conductive treatment. In the case that an on-state voltage is applied to the gate electrode 1025, a carrier channel is formed in the semiconductor region 1023A. At this time, carriers on the drain electrode 1027 may pass through the second conductor region 1023B2, the semiconductor region 1023A and the first conductor region 1023B1 to the source electrode 1026. It should be appreciated that, because the first conductor region 1023B1 is acquired by subjecting the semiconductor to conductive treatment, the first conductor region 1023B1 has a relatively large resistance, and thereby it is difficult for the carriers in the semiconductor region 1023A to pass through the first conductor region 1023B1.

In the embodiments of the present disclosure, as shown in FIG. 5, the light-shielding layer 2021 is connected to the semiconductor region 2023A and the source electrode 2026. In the case that the on-state voltage is applied to the gate electrode 2025 and the carrier channel is formed in the semiconductor region 2023A, the carriers in the semiconductor region 2023A may pass through the light-shielding layer 2021 having a relatively small resistance to the source electrode 2026, without any necessary to pass through the first conductor region 2023B having a relatively large resistance. As a result, it is able to facilitate the flow of the carriers on the gate electrode 2025 to the source electrode 2026, thereby to increase a movement speed of the carriers and improve the performance of the driving TFT.

Referring to FIG. 5 again, an orthogonal projection of the gate electrode 2025 onto the base substrate 201 overlaps an orthogonal projection of the light-shielding layer 2021 onto the base substrate 201. In this case, an overlapping capacitor may be formed by the gate electrode 2025 and the light-shielding layer 2021.

Figure 6:
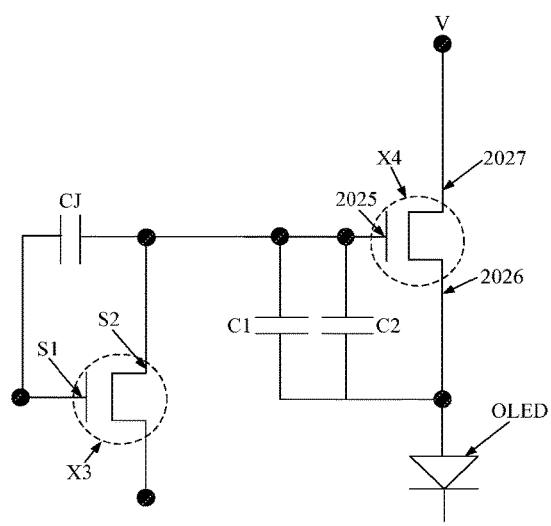
FIG. 6 is a schematic view showing an overlapping capacitor according to one embodiment of the present disclosure.

FIG. 6 is a schematic view showing an overlapping capacitor. As shown in FIG. 6 in conjunction with FIG. 5, one end of the overlapping capacitor C2 is the gate electrode 2025, and the other end thereof is the light-shielding layer 2021 connected to the source electrode 2026. One end of a pixel capacitor C1 is connected to the gate electrode 2025, and the other end thereof is connected to the source electrode 2026. Hence, the overlapping capacitor C2 is connected in parallel to the pixel capacitor C1. A capacitance of the parallel capacitor formed by the overlapping capacitor C2 and the pixel capacitor C1 is a sum of capacitances of the overlapping capacitor C2 and the pixel capacitor C1 (i.e., C1+C2), so a capacitance between the gate electrode 2025 and the source electrode 2026 (i.e., C1+C2) is greater than the capacitance of the pixel capacitor C1 in FIG. 3.

As shown in FIG. 3, a parasitic capacitor is formed between the gate electrode and the source electrode of the switching TFT. In the case that the on-state voltage is applied to the gate electrode of the driving TFT, a data voltage is applied to the source electrode of the driving TFT, so as to charge the pixel capacitor. In the case that the off-state voltage is applied to the gate electrode, a capacitance of the parasitic capacitor formed between the gate electrode and the source electrode of the switching TFT may change. In addition, the parasitic capacitor is connected in series to the pixel capacitor (both of them are arranged between the gate electrode of the switching TFT and the source electrode of the driving TFT), so the capacitance of the pixel capacitor may change too under the effect of the parasitic capacitor. At this time, the number of charges stored in the pixel capacitor may change, and a light-emitting state of the OLED may be adversely affected in the case that the pixel capacitor is discharged.

However, in the embodiments of the present disclosure, as shown in FIG. 6, two ends of each of the parallel capacitor (i.e., the capacitor formed by the overlapping capacitor C2 and the pixel capacitor C1 connected in parallel to each other) and the pixel capacitor C1 are connected to the gate electrode 2025 and the source electrode 2026 of the driving TFT X4 respectively, and the parallel capacitor has a capacitance larger than the pixel capacitor C1. Hence, in the embodiments of the present disclosure, a ratio of the capacitance of the parasitic capacitor CJ to a total capacitance of the capacitor formed between the gate electrode S1 of the switching TFT X3 and the source electrode 2026 of the driving TFT is smaller than a ratio of the capacitance of the parasitic capacitor to a total capacitance of the capacitor formed between the gate electrode S1 of the switching TFT X1 and the source electrode 1026 of the driving TFT X2 in FIG. 3. In the case that the capacitance of the parasitic capacitor CJ changes, the influence of the parasitic capacitor CJ on the parallel capacitor in the embodiments of the present disclosure is smaller than the influence of the parasitic capacitor on the pixel capacitor in FIG. 3. As a result, it is able to reduce a change in the number of the charges stored in the pixel capacitor C1, thereby to prevent the light-emitting state of the OLED from being adversely affected to some extent.

Referring to FIG. 5 again, a first via-hole 2028A and a second via-hole 2028B are formed in the interlayer dielectric layer 2028. The source electrode 2026 is connected to the light-shielding layer 2021 and the first conductor region 2023B through the first via-hole 2028A, and a lower part Y of the first via-hole 2028A is defined by the light-shielding layer 2021 and the first conductor region 2023B. The drain electrode 2027 is connected to the second conductor region 2023C through the second via-hole 2028B.

It should be appreciated that, in FIG. 1, the source electrode is in contact with the active layer through a via-hole in the interlayer dielectric layer, and the source electrode is connected to the light-shielding layer through another via-hole in the interlayer dielectric layer and a via-hole in the buffer layer. In other words, in FIG. 1, the source electrode is connected to the active layer and the light-shielding layer through three via-holes. However, in the embodiments of the present disclosure, as shown in FIG. 5, the source electrode 2026 is connected to the first conductor region 2023B of the active layer 2023 and the light-shielding layer 2021 through merely one via-hole (i.e., the first via-hole 2028A) in the interlayer dielectric layer 2028. As a result, it is able to reduce the number of the via-holes, thereby to facilitate the manufacture of the driving TFT.

Because fewer via-holes need to be formed during the manufacture of the driving TFT, it is able to reduce the number of etching steps, thereby to prevent the layers of the driving TFT from being damaged to some extent and improve the yield of the driving TFT. In addition, because the number of via-holes (one via-hole) in the interlayer dielectric layer corresponding to the source electrode in the embodiments of the present disclosure is smaller than the number of via-holes (two via-holes) in the interlayer dielectric layer corresponding to the source electrode in FIG. 1, it is able to reduce an area of the driving TFT, thereby to reduce a layout space for the driving TFT.

Figure 7:
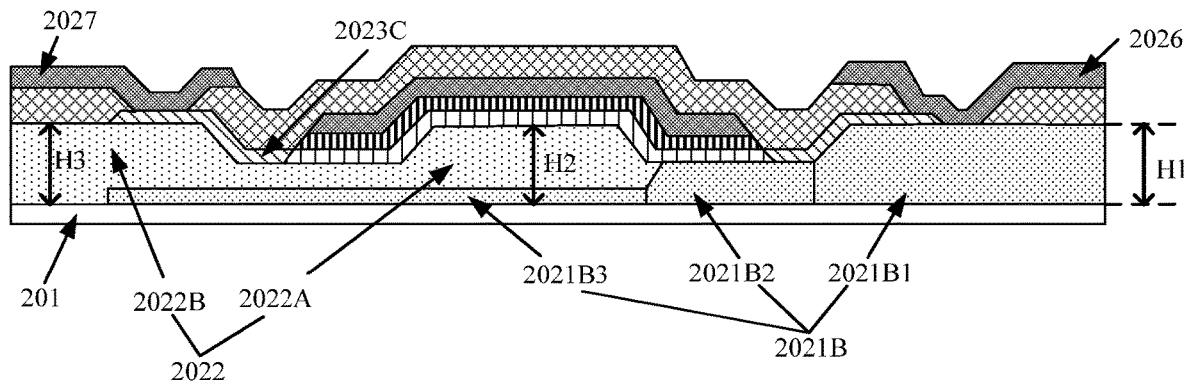
FIG. 7 is a schematic view showing distances between layers of the back plate in FIG. 5 and a base substrate according to one embodiment of the present disclosure.

In a possible embodiment, as shown in FIG. 7, the light-shielding layer 2021 may include a first thickness region 2021B1, a second thickness region 2021B2 and a third thickness region 2021B3 arranged sequentially in a descending order of thicknesses. A distance H1 between the base substrate 201 and a surface of the first thickness region 2021B1 away from the base substrate 201 is equal to a distance H2 between the base substrate 201 and a surface of the first protrusion 2022A away from the base substrate 201. The source electrode 2026 may be connected to the first thickness region 2021B1.

The buffer layer 2022 may be further provided with a second protrusion 2022B. A distance H3 between the base substrate 201 and a surface of the second protrusion 2022B away from the base substrate 201 is equal to the distance H2 between the base substrate 201 and the surface of the first protrusion 2022A away from the base substrate 201. The drain electrode 2027 may be connected to a portion of the second conductor region 2023C on the second protrusion 2022B.

In a possible embodiment of the present disclosure, the active layer may be made of amorphous indium gallium zinc oxide (a-IGZO), zinc oxynitride (ZnON), indium zinc tin oxide (IZTO), amorphous silicon (a-Si), polysilicon (p-Si), sexithiophene or polythiophene, which will not be particularly defined herein.

In a possible embodiment of the present disclosure, as a dielectric layer, each of the buffer layer, the interlayer dielectric layer and the gate insulation layer may be made of silicon oxide (SiOx), silicon nitride (SiNx) or silicon oxynitride (SiON), or a material having a high dielectric constant, e.g., aluminum oxide (AlOx), hafnium oxide (HfOx) or tantalum oxide (TaOx), or an organic insulation layer.

In a possible embodiment of the present disclosure, the light-shielding layer may be made of a light-shielding conductive material. Each of the gate electrode, the source electrode and the drain electrode may be made of a common metal material, e.g., argentum (Ag), copper (Cu), aluminium (Al) or molybdenum (Mo). Each of the gate electrode, the source electrode and the drain electrode may also be of a multi-layered structure, e.g., Mo/Cu/Mo. In addition, each of the gate electrode, the source electrode and the drain electrode may also be made of an alloy (e.g., aluminium neodymium (AlNd) or molybdenum niobium (MoNb)), or a metal oxide (e.g., indium tin oxide (ITO) or aluminum-doped zinc oxide (AZO)), which will not be particularly defined herein.

It should be appreciated that, the gate electrode of the driving TFT is arranged above the active layer of the driving TFT, so the driving TFT is a top-gate TFT. The light-shielding layer of the driving TFT may also be called as a shielding metal (SH) layer.

In a word, according to the back plate in the embodiments of the present disclosure, due to the first protrusion, two lateral portions of the gate electrode and two lateral portions of the active layer are curved toward the base substrate, so as to enable the gate electrode in a curved state to shield the active layer and prevent the light beam from entering the active layer from the two sides of the gate electrode, thereby to improve the NBTIS of the driving TFT, and ensure the display effect of the OLED display panel.

Figure 8:
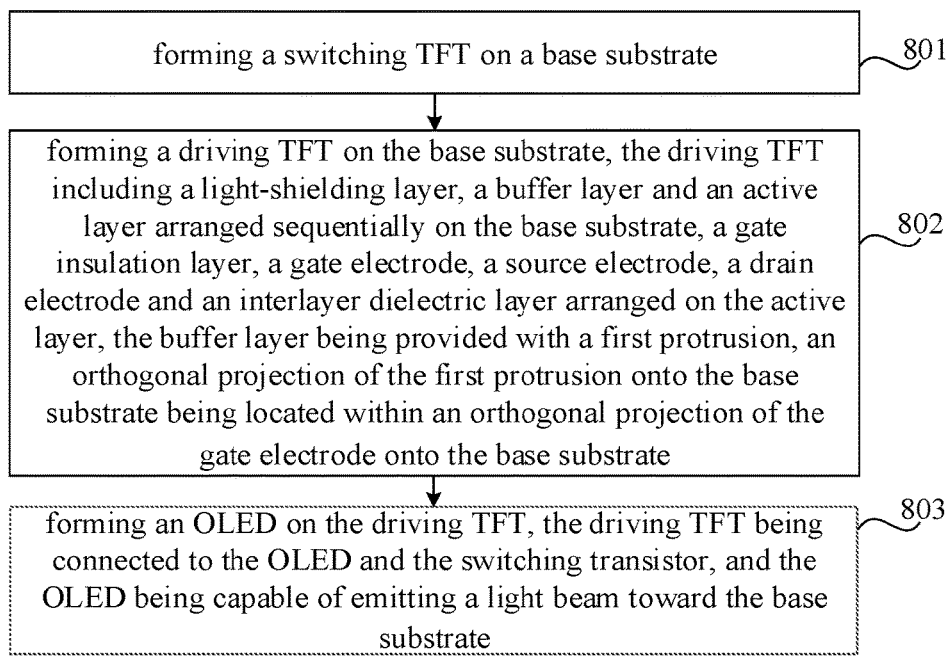
FIG. 8 is a flow chart of a method for manufacturing the back plate according to one embodiment of the present disclosure.

The present disclosure further provides in some embodiments a method for manufacturing the back plate in FIG. 4 or 5. As shown in FIG. 8, the method may include: Step 801 of forming a switching TFT on a base substrate; Step 802 of forming a driving TFT on the base substrate, the driving TFT including a light-shielding layer, a buffer layer and an active layer arranged sequentially on the base substrate, a gate insulation layer, a gate electrode, a source electrode, a drain electrode and an interlayer dielectric layer arranged on the active layer, the buffer layer being provided with a first protrusion, an orthogonal projection of the first protrusion onto the base substrate being located within an orthogonal projection of the gate electrode onto the base substrate; and Step 803 of forming an OLED on the driving TFT, the driving TFT being connected to the OLED and the switching transistor, and the OLED being capable of emitting a light beam toward the base substrate.

According to the manufacture method in the embodiments of the present disclosure, due to the first protrusion, two lateral portions of the gate electrode and two lateral portions of the active layer are curved toward the base substrate, so as to enable the gate electrode in a curved state to shield the active layer and prevent the light beam from entering the active layer from the two sides of the gate electrode, thereby to improve the NBTIS of the driving TFT, and ensure the display effect of the OLED display panel.

Figure 9:
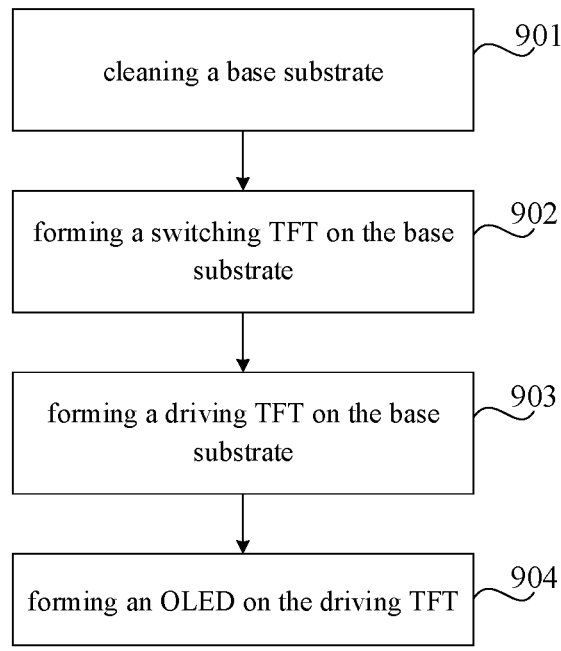
FIG. 9 is another flow chart of the method for manufacturing the back plate according to one embodiment of the present disclosure.

The present disclosure further provides in some embodiments another method for manufacturing the back plate in FIG. 5. As shown in FIG. 9, the method may include the following steps.

Step 901: cleaning a base substrate. During the manufacture, it is necessary to clean the base substrate, so as to remove impurities on the base substrate, thereby to prevent the performance of the back plate from being adversely affected by the impurities.

Step 902: forming a switching TFT on the base substrate.

Figure 10:
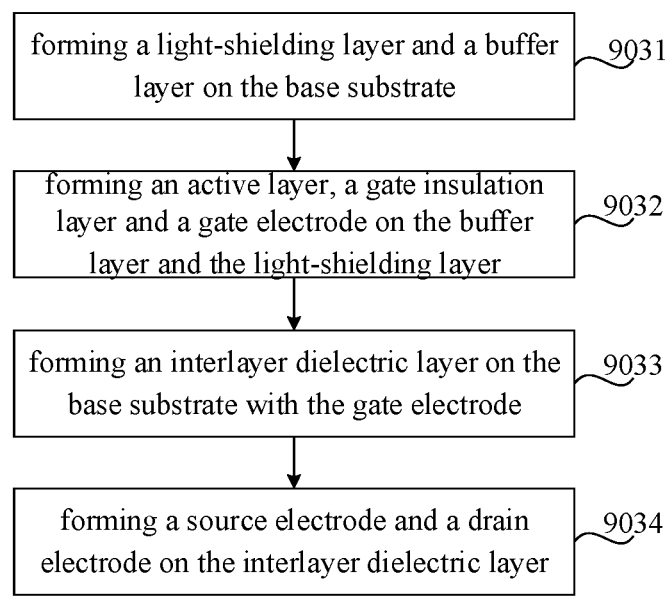
FIG. 10 is a flow chart of a step of forming the driving TFT according to one embodiment of the present disclosure.

Step 903: forming a driving TFT on the base substrate. As shown in FIG. 10, Step 903 may include the following steps.

Step 9031: forming a light-shielding layer and a buffer layer on the base substrate.

Figure 11:
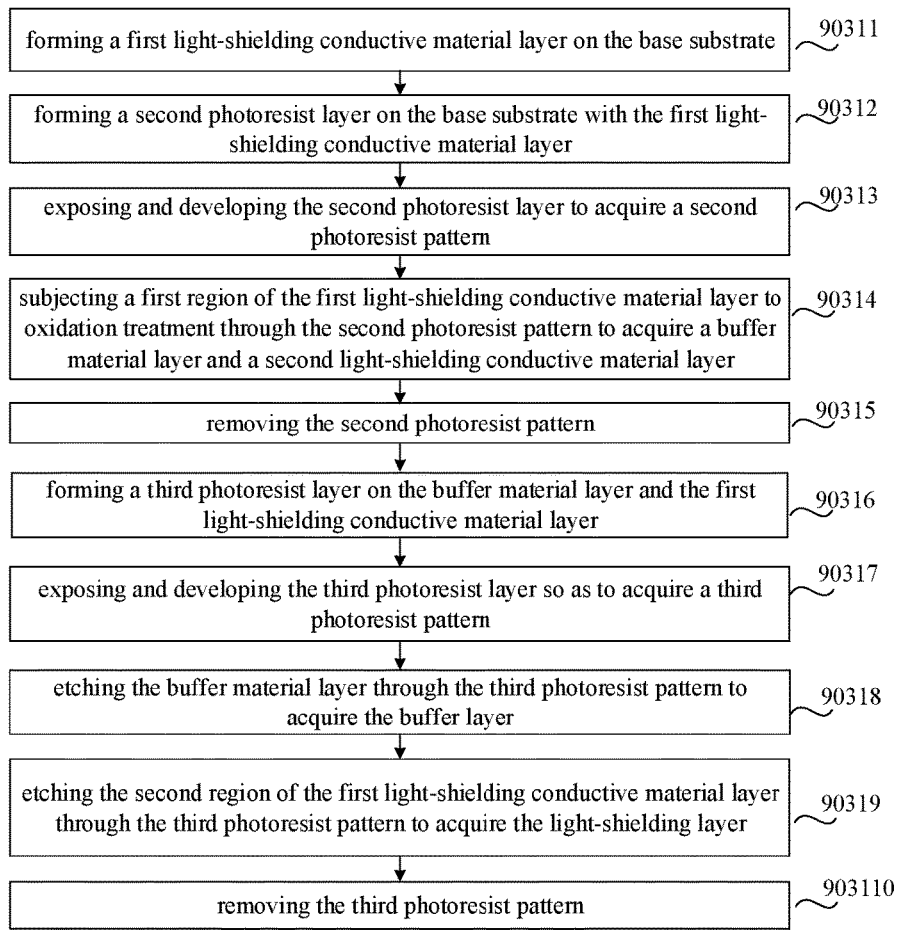
FIG. 11 is a flow chart of a step of forming a light-shielding layer and a buffer layer according to one embodiment of the present disclosure.

As shown in FIG. 11, Step 9031 may include the following steps.

Figure 12:
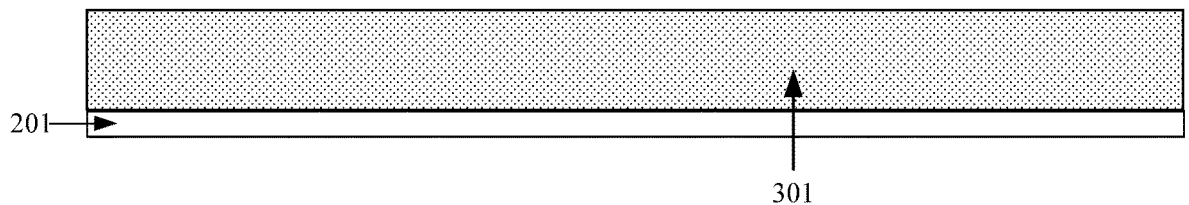
FIG. 12 is a partial schematic view showing the back plate according to one embodiment of the present disclosure.

Step 90311: forming a first light-shielding conductive material layer on the base substrate. As shown in FIG. 12, in Step 90311, the first light-shielding conductive material layer 301 may be formed on the base substrate 201 at first. It should be appreciated that, the first light-shielding conductive material layer may be a conductor having a light-shielding function. For example, the first light-shielding conductive material layer may be deposited onto the base substrate 201 through coating, magnetron-sputtering, thermal evaporation or plasma enhanced chemical vapor deposition (PECVD).

Figure 13:
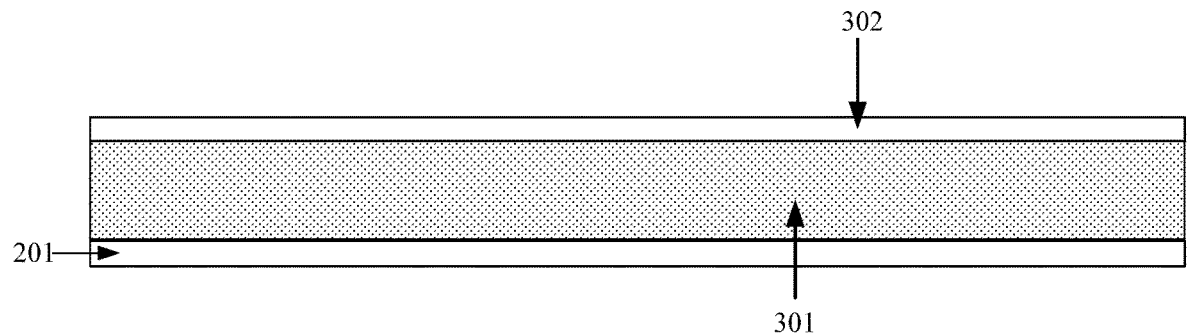
FIG. 13 is another partial schematic view showing the back plate according to one embodiment of the present disclosure.

Step 90312: forming a second photoresist layer on the base substrate with the first light-shielding conductive material layer. As shown in FIG. 13, in Step 90312 the second photoresist layer 302 may be formed on the base substrate 201 with the first light-shielding material layer 301 through coating, magnetron-sputtering, thermal evaporation or PECVD.

Figure 14:
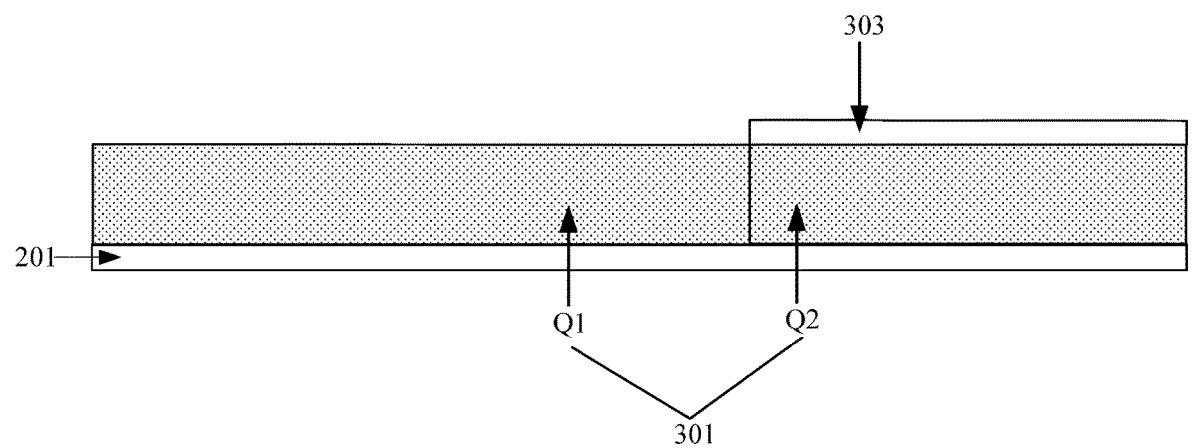
FIG. 14 is yet another partial schematic view showing the back plate according to one embodiment of the present disclosure.

Step 90313: exposing and developing the second photoresist layer, so as to acquire a second photoresist pattern. As shown in FIGS. 13 and 14, in Step 90313, the second photoresist layer 302 may be exposed and developed, so as to form the second photoresist pattern 303. It should be appreciated that, the first light-shielding conductive material layer 301 may include a first region Q1 where the buffer layer is to be formed and a second region Q2 where the second photoresist pattern 303 is formed.

Step 90314: subjecting the first region of the first light-shielding conductive material layer to oxidation treatment through the second photoresist pattern, so as to acquire a buffer material layer and a second light-shielding conductive material layer.

Prior to Step 90314, the second photoresist pattern covers the second region Q2 rather than the first region Q1 of the first light-shielding conductive material layer. Hence, in Step 90314, it is able to subject the first region to oxidation treatment using the second photoresist pattern. For example, the first region Q1 may be subjected to oxygen plasma treatment, oxygen-based high-temperature annealing treatment or anode oxidation treatment.

Figure 15:
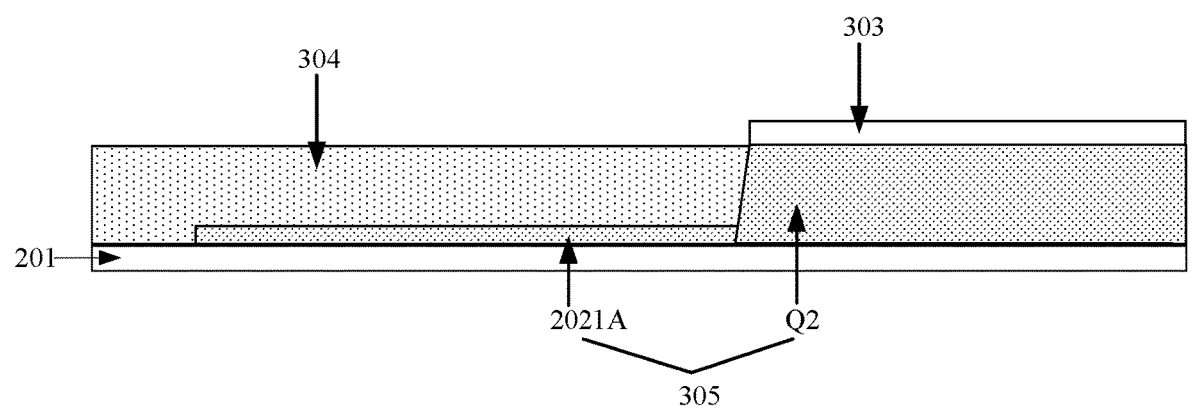
FIG. 15 is still yet another partial schematic view showing the back plate according to one embodiment of the present disclosure.

As shown in FIG. 15, subsequent to the oxidation treatment on the first region, a first portion of the first light-shielding conductive material layer at an outer side of the first region may be converted from a conductor into an oxide, and a second portion 2021A at an inner side of the first region may remain as the light-shielding conductive material. At this time, it is able to acquire the buffer material layer 304 and the second light-shielding conductive material layer 305. The buffer material layer 304 includes the first portion at the first region which has been oxidized, and the second light-shielding conductive material layer 305 includes the second portion 2021A at the first region Q1 which has not been oxidized and the second region Q2 of the first light-shielding conductive material layer. The first portion covers the second portion 2021A, and the second portion 2021A is connected to the second region Q2.

Figure 16:
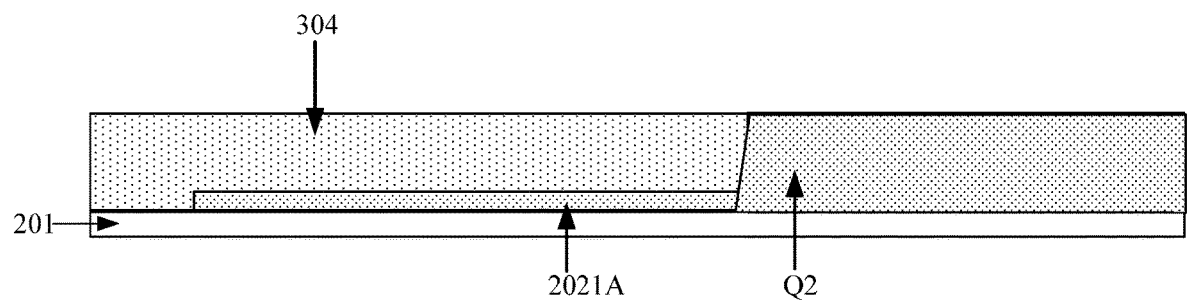
FIG. 16 is still yet another partial schematic view showing the back plate according to one embodiment of the present disclosure.

Step 90315: removing the second photoresist pattern. In Step 90315, the second photoresist pattern 303 may be removed, so as to acquire a structure as shown in FIG. 16.

Figure 17:
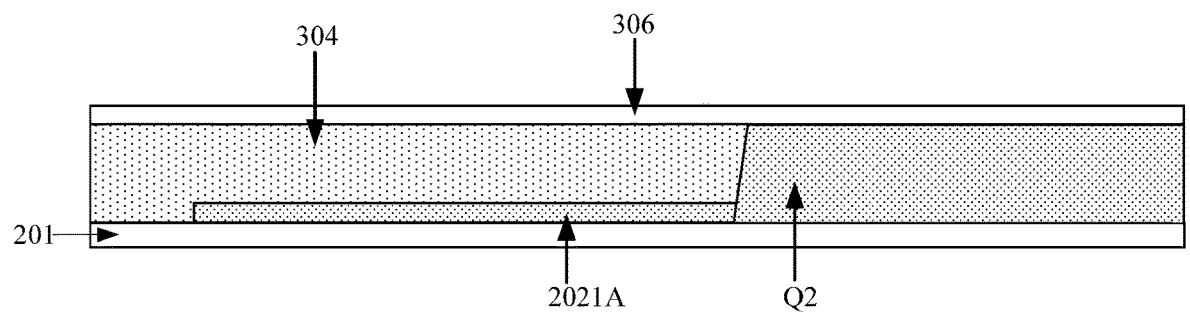
FIG. 17 is still yet another partial schematic view showing the back plate according to one embodiment of the present disclosure.

Step 90316: forming a third photoresist layer on the buffer material layer and the first light-shielding conductive material layer. As shown in FIG. 17, in Step 90316, the third photoresist layer 306 may be formed on the buffer material layer 304 and the first light-shielding conductive material layer through coating, magnetron-sputtering, thermal evaporation or PECVD.

Figure 18:
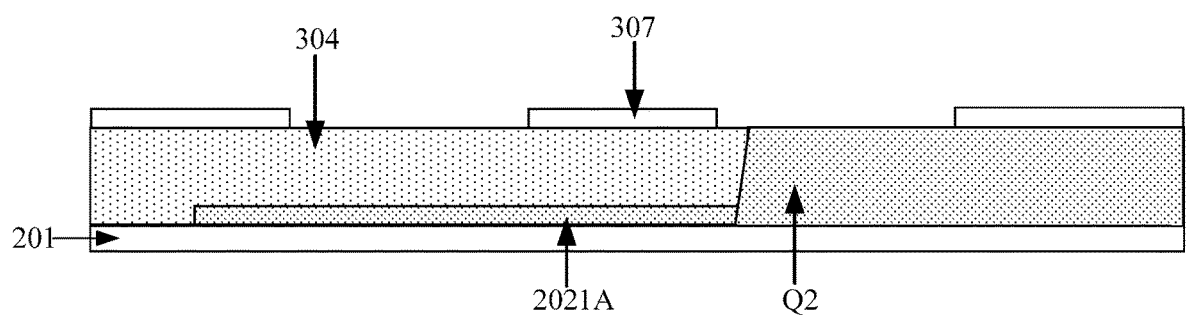
FIG. 18 is still yet another partial schematic view showing the back plate according to one embodiment of the present disclosure.

Step 90317: exposing and developing the third photoresist layer so as to acquire a third photoresist pattern. As shown in FIG. 18, the gate electrode is to be formed at a region of the buffer material layer 304 adjacent to the second region Q2 of the second light-shielding conductive material layer 305 which has not been oxidized, the drain electrode is to be formed at a region of the buffer material layer 304 away from the second region Q2, and the source electrode is to be formed at a position in the second region Q2 away from the buffer material layer 304.

In Step 90317, the third photoresist layer may be exposed and developed, so as to acquire the third photoresist pattern 307 covering a region where the gate electrode, the drain electrode and the source electrode are to be formed.

Figure 19:
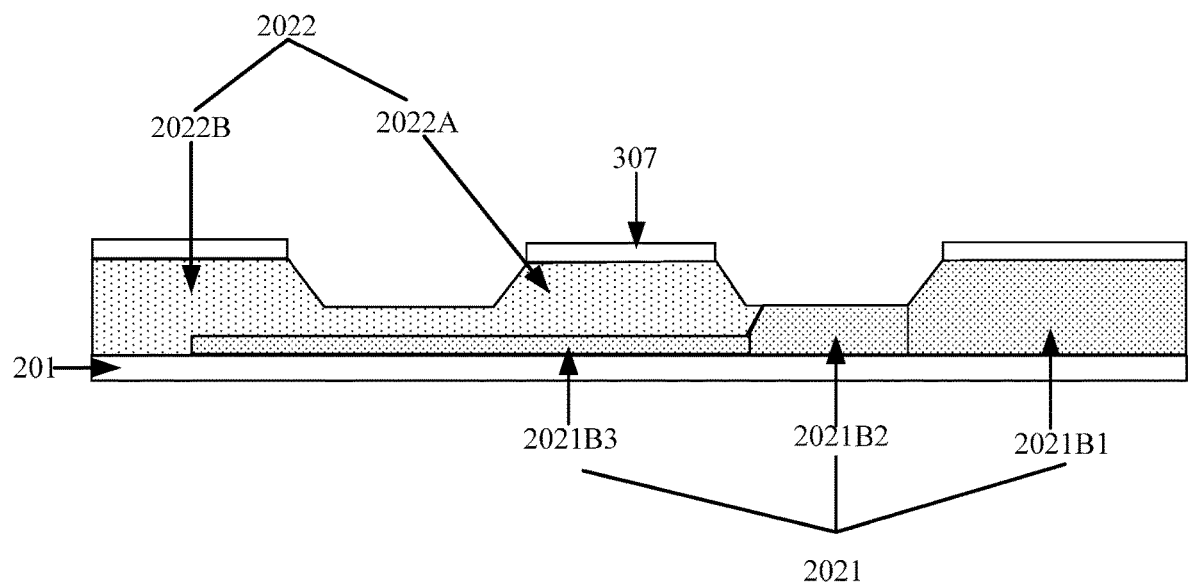
FIG. 19 is still yet another partial schematic view showing the back plate according to one embodiment of the present disclosure.

Step 90318: etching the buffer material layer through the third photoresist pattern, so as to acquire the buffer layer. As shown in FIG. 19, in Step 90318, the buffer material layer may be etched through the third photoresist pattern 307, so as to reduce a thickness of a portion of the buffer material layer not covered by the third photoresist pattern 307, thereby to acquire the buffer layer 2022.

The buffer layer is provided with a first protrusion 2022A and a second protrusion 2022B, and an orthogonal projection of the first protrusion 2022A onto the base substrate 201 is located within an orthogonal projection of the gate electrode onto the base substrate. A distance between the base substrate 201 and a surface of the second protrusion 2022B away from the base substrate 201 is equal to a distance between the base substrate 201 and a surface of the first protrusion 2022A away from the base substrate 201, i.e., the first protrusion 2022A is flush with the second protrusion 2022B.

Step 90319: etching the second region of the first light-shielding conductive material layer through the third photoresist pattern, so as to acquire the light-shielding layer. Referring to FIG. 19 again, in Step 90319, the second region of the first light-shielding conductive material layer which has not be oxidized may be etched through the third photoresist pattern 307, so as to reduce a thickness of a portion of the second region not covered by the third photoresist pattern 307, thereby to acquire the light-shielding layer 2021.

The light-shielding layer 2021 includes a first thickness region 2021B1, a second thickness region 2021B2 and a third thickness region 2021B3 (i.e., the second portion 2021A in FIG. 18) arranged sequentially in a descending order of thicknesses. A distance between the base substrate 201 and a surface of the first thickness region 2021B1 away from the base substrate 201 is equal to the distance between the base substrate 201 and the surface of the first protrusion 2022A away from the base substrate 201.

Figure 20:
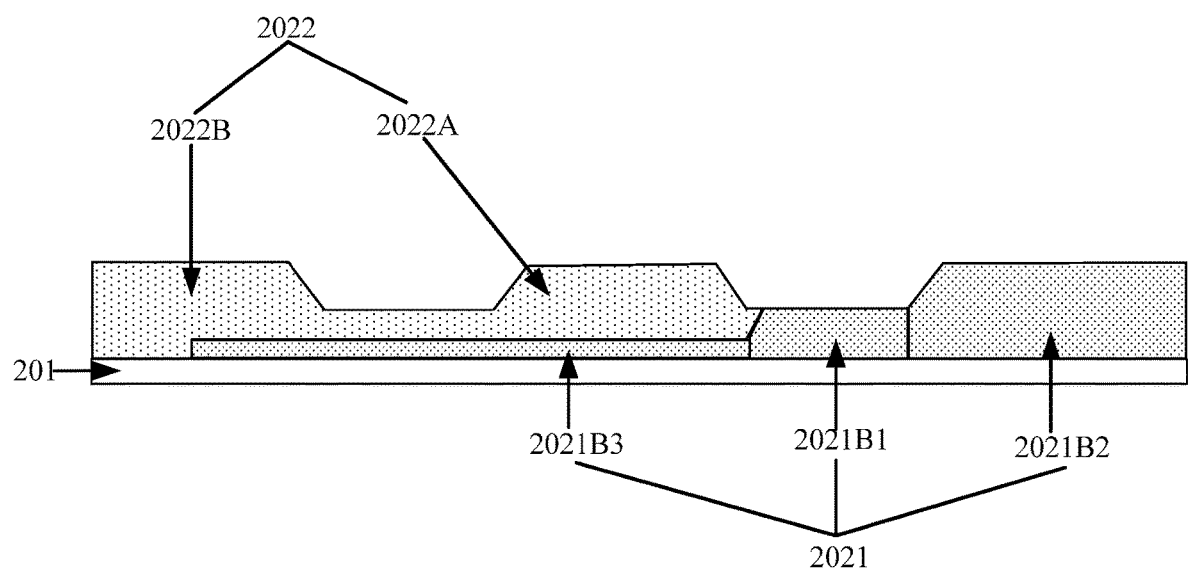
FIG. 20 is still yet another partial schematic view showing the back plate according to one embodiment of the present disclosure.

Step 903110: removing the third photoresist pattern. In Step 903110, the third photoresist pattern 307 may be removed, so as to acquire a structure as shown in FIG. 20.

Figure 21:
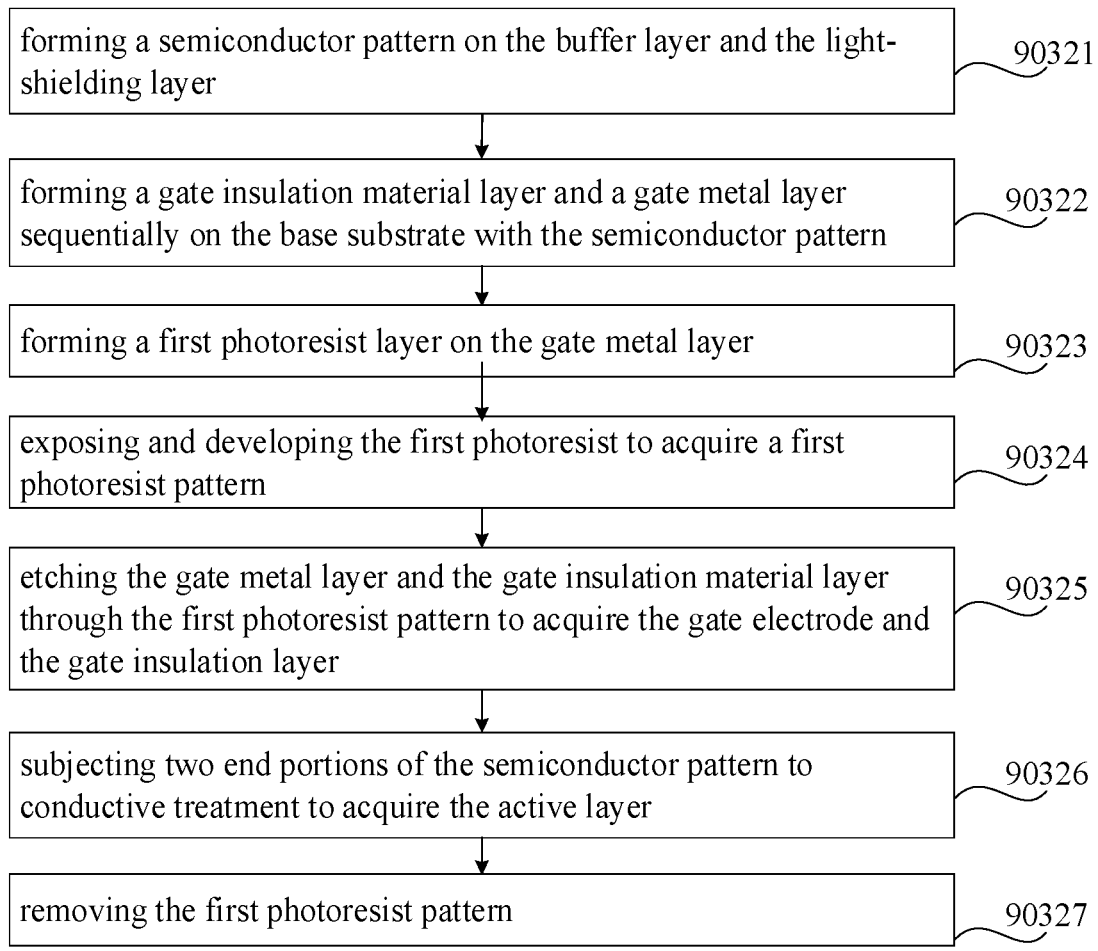
FIG. 21 is a flow chart of a step of forming an active layer, a gate insulation layer and a gate electrode according to one embodiment of the present disclosure.

Step 9032: forming the active layer, the gate insulation layer and the gate electrode on the buffer layer and the light-shielding layer. As shown in FIG. 21, Step 9032 may include the following steps.

Figure 22:
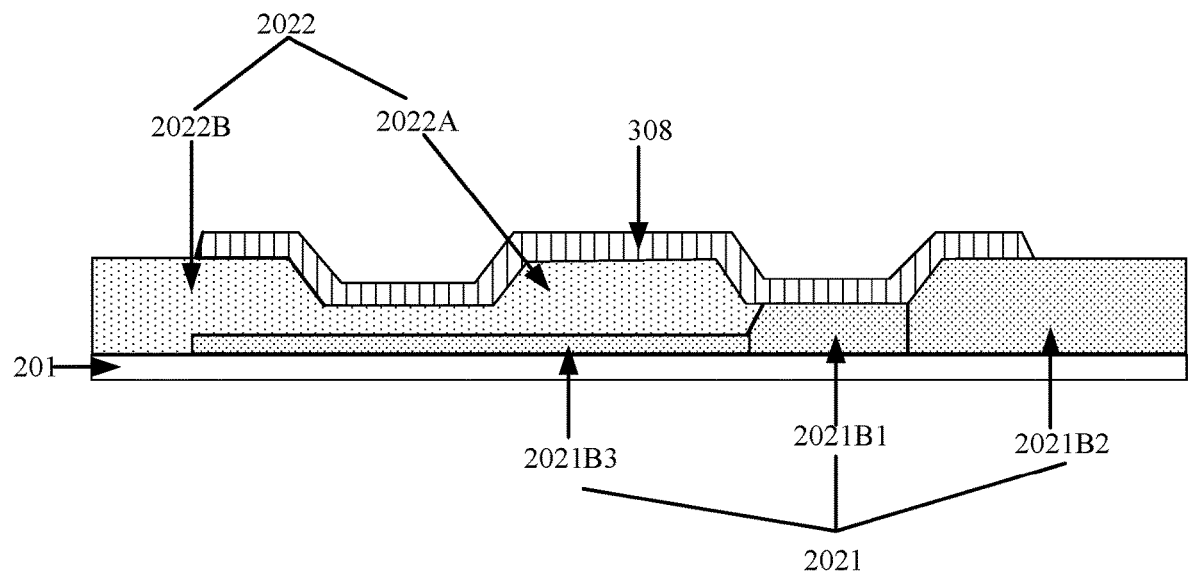
FIG. 22 is still yet another partial schematic view showing the back plate according to one embodiment of the present disclosure.

Step 90321: forming a semiconductor pattern on the buffer layer and the light-shielding layer. As shown in FIGS. 20 and 22, in Step 90321, a semiconductor material layer may be formed on the buffer layer 2022 and the light-shielding layer 2021, and then patterned through a single patterning process, so as to acquire the semiconductor pattern 308 in FIG. 22.

Figure 23:
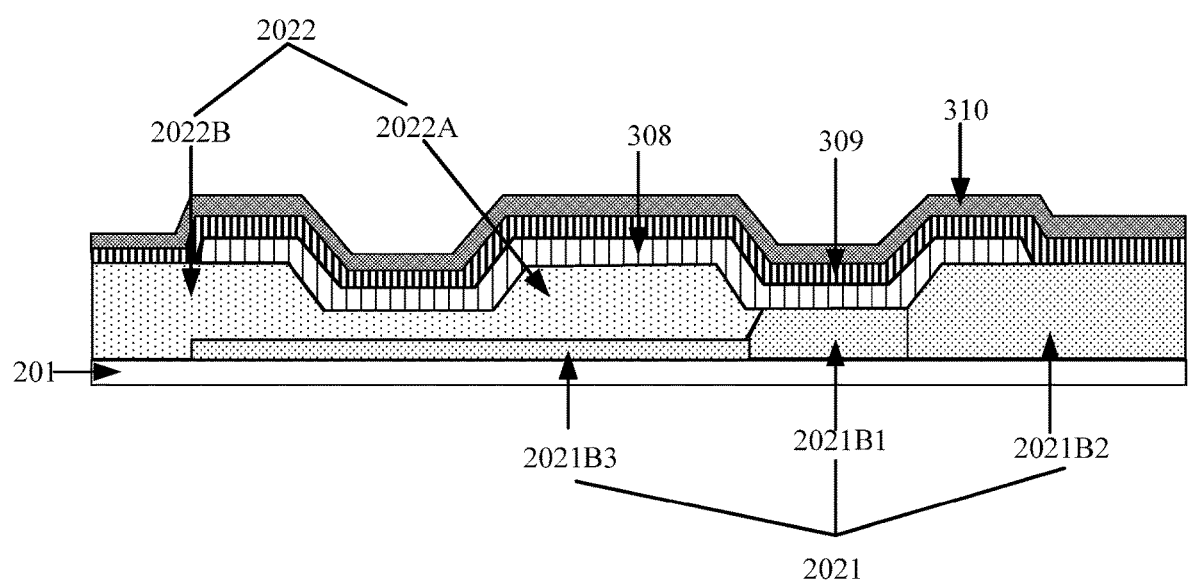
FIG. 23 is still yet another partial schematic view showing the back plate according to one embodiment of the present disclosure.

Step 90322: forming a gate insulation material layer and a gate metal layer sequentially on the base substrate with the semiconductor pattern. As shown in FIG. 23, in Step 90322, the gate insulation material layer 309 and the gate metal layer 310 may be formed sequentially on the base substrate 201 with the semiconductor pattern 308.

Figure 24:
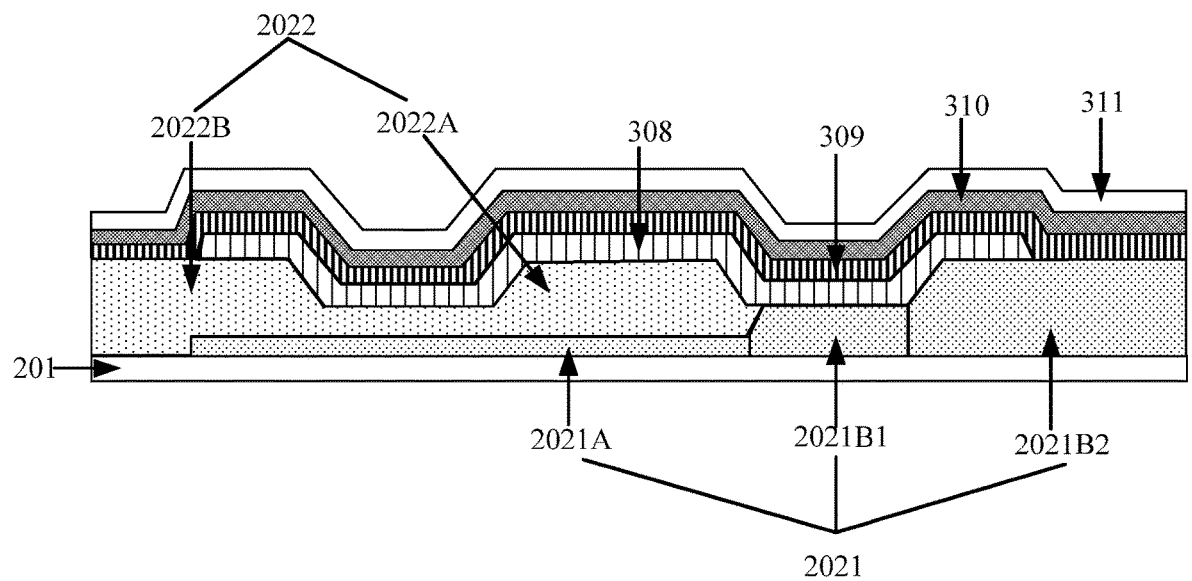
FIG. 24 is still yet another partial schematic view showing the back plate according to one embodiment of the present disclosure.

Step 90323: forming a first photoresist layer on the gate metal layer. As shown in FIG. 24, in Step 90323, the first photoresist layer 311 may be formed on the gate metal layer 310 through coating, magnetron-sputtering, thermal evaporation or PECVD.

Figure 25:
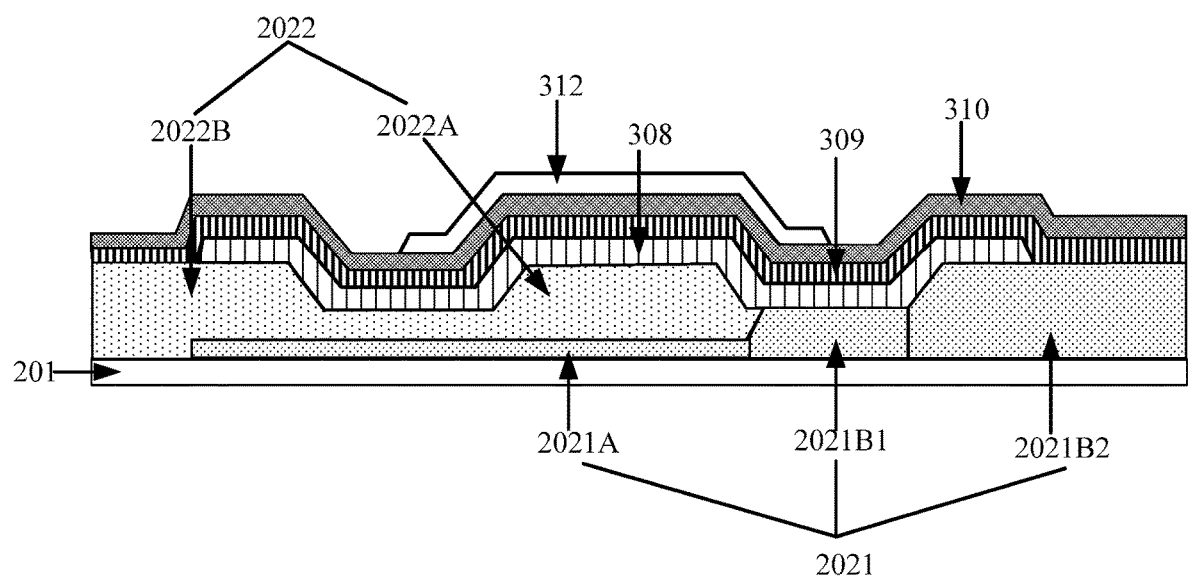
FIG. 25 is still yet another partial schematic view showing the back plate according to one embodiment of the present disclosure.
Figure 26:
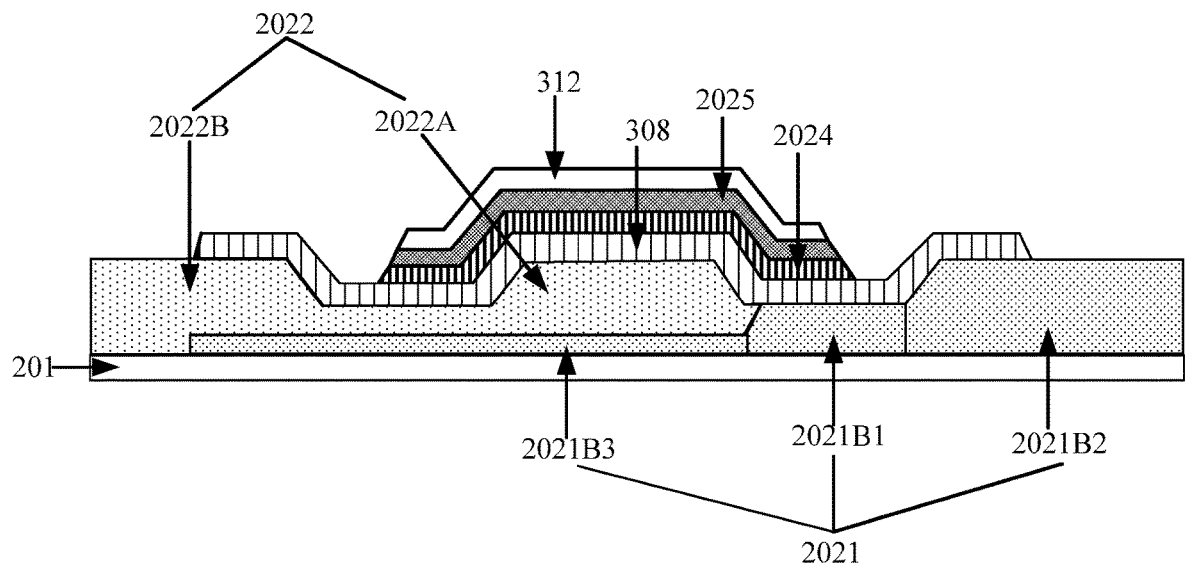
FIG. 26 is still yet another partial schematic view showing the back plate according to one embodiment of the present disclosure.

Step 90324: exposing and developing the first photoresist so as to acquire a first photoresist pattern. As shown in FIGS. 24 and 25, in Step 90324, the first photoresist layer 311 may be exposed and developed, so as to remove a portion of the first photoresist layer 311, thereby to acquire the first photoresist pattern 312 in FIG. 25. For example, the first photoresist pattern 312 may cover a region of the gate metal layer 310 where the gate electrode is to be formed.

Step 90325: etching the gate metal layer and the gate insulation material layer through the first photoresist pattern, so as to acquire the gate electrode and the gate insulation layer. In Step 90324, the first photoresist pattern covers a portion of the gate electrode layer, so in Step 90325, portions of the gate metal layer and the gate insulation material layer not covered by the first photoresist pattern may be etched through the first photoresist pattern, so as to acquire the gate electrode 2025 and the gate insulation layer 2024 in FIG. 28.

In a possible embodiment of the present disclosure, the orthogonal projection of the first protrusion 2022A onto the base substrate 201 may be located within the orthogonal projection of the gate electrode 2025 onto the base substrate 201, and the orthogonal projection of the gate electrode 2025 onto the base substrate 201 may overlap the orthogonal projection of the light-shielding layer 2021 onto the base substrate 201.

Figure 27:
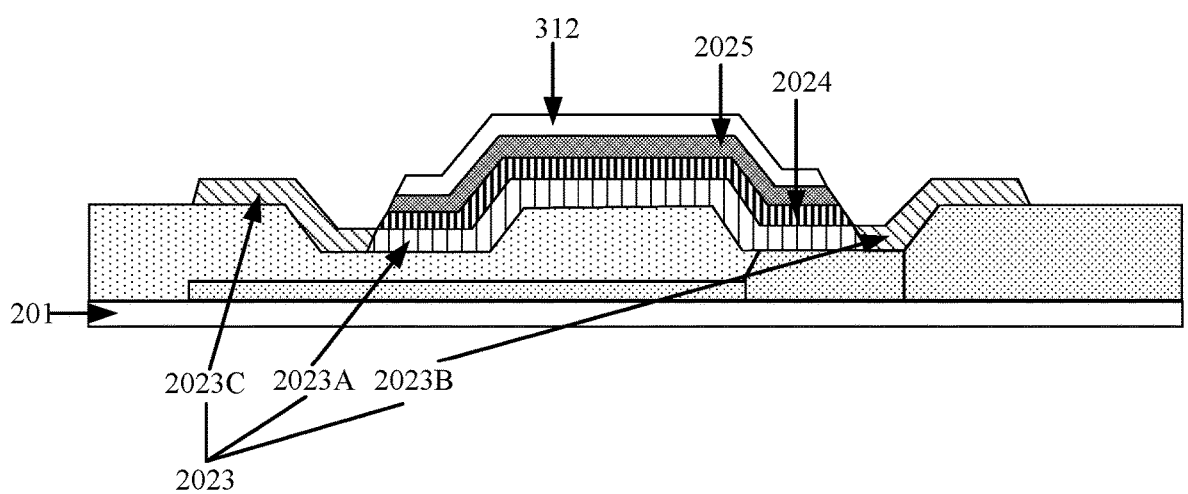
FIG. 27 is still yet another partial schematic view showing the back plate according to one embodiment of the present disclosure.

Step 90326: subjecting two end portions of the semiconductor pattern to conductive treatment, so as to acquire the active layer. It should be appreciated that, prior to Step 90326, the first photoresist pattern 312 covers the gate electrode 2025, a middle portion of the semiconductor pattern is covered by the gate insulation layer 2024 and the gate electrode 2025, and the two end portions of the semiconductor pattern is not covered with any layer. Hence, in Step 90326, the two end portions of the semiconductor pattern may be subjected to conductive treatment through the gate insulation layer 2024, the gate electrode 2025 and the first photoresist pattern 312, so as to acquire the active layer 2023 in FIG. 27.

For example, the active layer 2023 may include a semiconductor region 2023A, and a first conductor region 2023B and a second conductor region 2023C arranged at two sides of the semiconductor regions respectively. The two end portions of the semiconductor pattern may be subjected to the conductive treatment through ion injection or hydrogenation, so as to acquire the first conductor region 2023B and the second conductor region 2023C.

It should be further appreciated that, the semiconductor region 2023A and the first conductor region 2023B may be connected to the light-shielding layer 2021. In addition, each of the first conductor region 2023B and the second conductor region 2023C is acquired by subjecting a semiconductor to conductive treatment, and the light-shielding layer 2021 itself is a conductor acquired not through the conductive treatment, so the light-shielding layer 2021 has a resistance smaller than the first conductor region 2023B.

Figure 28:
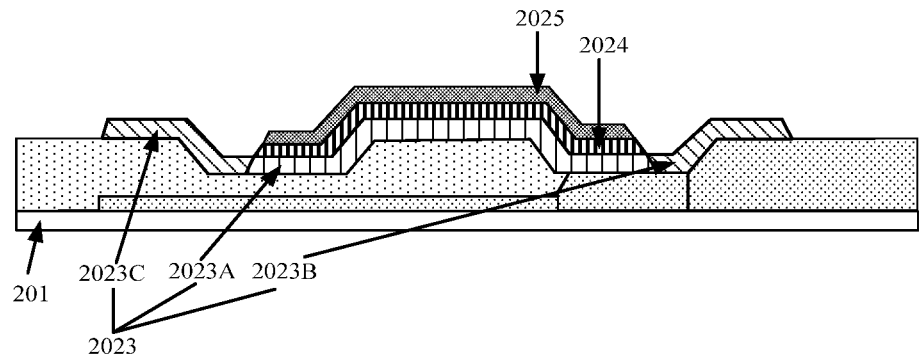
FIG. 28 is still yet another partial schematic view showing the back plate according to one embodiment of the present disclosure.

Step 90327: removing the first photoresist pattern. In Step 90327, the first photoresist pattern 312 may be removed, so as to acquire a structure as shown in FIG. 28.

Figure 29:
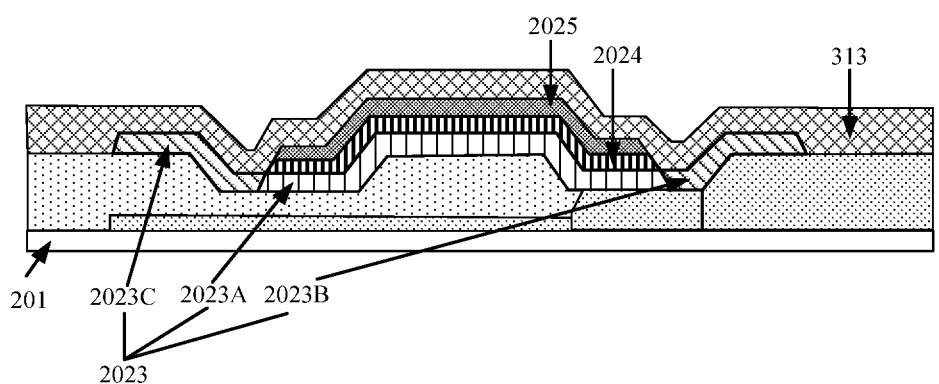
FIG. 29 is still yet another partial schematic view showing the back plate according to one embodiment of the present disclosure.
Figure 30:
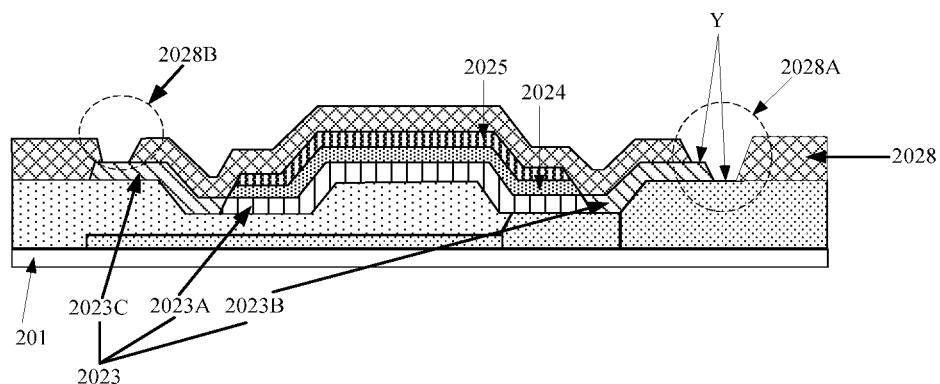
FIG. 30 is still yet another partial schematic view showing the back plate according to one embodiment of the present disclosure.

Step 9033: forming the interlayer dielectric layer on the base substrate with the gate electrode. As shown in FIG. 29, in Step 9033, a dielectric material layer 313 may be formed on the base substrate 201 with the gate electrode 2025, and next, as shown in FIG. 30, a first via-hole 2028A and a second via-hole 2028B may be formed in the dielectric material layer, so as to acquire the interlayer dielectric layer 2028. A lower part Y of the first via-hole 2028A is defined by the light-shielding layer 2021 and the first conductor region 2023B.

Step 9034: forming the source electrode and the drain electrode on the interlayer dielectric layer. In Step 9034, the source electrode and the drain electrode may be formed on the interlayer dielectric layer, so as to acquire the driving TFT as shown in FIG. 5. The source electrode 2026 is connected to the first conductor region 2023B and the light-shielding layer 2021 (e.g., the first thickness region of the light-shielding layer 2021) through the first via-hole 2028A. The drain electrode 2027 is connected to the second conductor region 2023C through the second via-hole 2028B, e.g., a portion of the second conductor region 2023C on the second protrusion of the buffer layer 2022.

Step 904: forming an OLED on the driving TFT. The driving TFT is connected to the OLED and the switching transistor, and the OLED is capable of emitting a light beam toward the base substrate.

In a word, according to the back plate and the manufacture method thereof in the embodiments of the present disclosure, due to the first protrusion, two lateral portions of the gate electrode and two lateral portions of the active layer are curved toward the base substrate, so as to enable the gate electrode in a curved state to shield the active layer and prevent the light beam from entering the active layer from the two sides of the gate electrode, thereby to improve the NBTIS of the driving TFT, and ensure the display effect of the OLED display panel.

It should be appreciated that, the implementation of the manufacture method may refer to that of the back plate. An order of the steps in the manufacture method may be adjusted appropriately. In addition, in actual use, some steps may be omitted, or any other appropriate steps may be added.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A back plate, comprising a base substrate and a driving thin film transistor (TFT) arranged on the base substrate, wherein the driving TFT comprises a light-shielding layer, a buffer layer and an active layer arranged sequentially on the base substrate;
   a gate insulation layer, a gate electrode, a source electrode, a drain electrode and an interlayer dielectric layer are arranged on the active layer; and
   the buffer layer is provided with a first protrusion, and an orthogonal projection of the first protrusion onto the base substrate is located within an orthogonal projection of the gate electrode onto the base substrate.

2. The back plate according to claim 1, wherein the buffer layer is arranged on the light-shielding layer, and the active layer is arranged on the buffer layer and the light-shielding layer;
   the active layer comprises a semiconductor region, and a first conductor region and a second conductor region arranged at two sides of the semiconductor region;
   the light-shielding layer has a resistance smaller than the first conductor region; and
   the first conductor region is connected to the source electrode, the second conductor region is connected to the drain electrode, and the semiconductor region, the first conductor region and the source electrode are connected to the light-shielding layer.

3. The back plate according to claim 2, wherein the orthogonal projection of the gate electrode onto the base substrate overlaps an orthogonal projection of the light-shielding layer onto the base substrate.

4. The back plate according to claim 2, wherein a first via-hole and a second via-hole are formed in the interlayer dielectric layer;
   the source electrode is connected to the light-shielding layer and the first conductor region through the first via-hole, and a lower part of the first via-hole is defined by the light-shielding layer and the first conductor region; and
   the drain electrode is connected to the second conductor region through the second via-hole.

5. The back plate according to claim 2, wherein the light-shielding layer comprises a first thickness region, a second thickness region and a third thickness region;
   a distance between the base substrate and a surface of the first thickness region away from the base substrate is equal to a distance between the base substrate and a surface of the first protrusion away from the base substrate;
   the source electrode is connected to the first thickness region;
   the buffer layer is further provided with a second protrusion, and a distance between the base substrate and a surface of the second protrusion away from the base substrate is equal to the distance between the base substrate and the surface of the first protrusion away from the base substrate; and
   the drain electrode is connected to a portion of the second conductor region arranged on the second protrusion;
   the first thickness region, the second thickness region and the third thickness region are arranged sequentially in a descending order of thicknesses along a direction from an end of the base substrate away from the second protrusion to the second protrusion.

6. The back plate according to claim 1, wherein the active layer is made of one or more of amorphous indium gallium zinc oxide, zinc oxynitride, indium zinc tin oxide, amorphous silicon, poly-silicon, sexithiophene and polythiophene.

7. The back plate according to claim 1, further comprising a switching TFT and an organic light-emitting diode (OLED) both arranged on the base substrate, wherein the driving TFT is connected to the OLED and the switching TFT, and the OLED is capable of emitting a light beam toward the base substrate.

8. A method for manufacturing a back plate, comprising a step of forming a driving thin film transistor (TFT) on a base substrate, wherein the driving transistor comprises a light-shielding layer, a buffer layer and an active layer arranged sequentially on the base substrate;
   a gate insulation layer, a gate electrode, a source electrode, a drain electrode and an interlayer dielectric layer are arranged on the active layer; and
   the buffer layer is provided with a first protrusion, and an orthogonal projection of the first protrusion onto the base substrate is located within an orthogonal projection of the gate electrode onto the base substrate.

9. The method according to claim 8, wherein the step of forming the driving TFT on the base substrate comprises:
   forming the light-shielding layer and the buffer layer on the base substrate, the buffer layer being arranged on the light-shielding layer;
   forming the active layer, the gate insulation layer and the gate electrode on the buffer layer and the light-shielding layer, the active layer being arranged on the buffer layer and the light-shielding layer and comprising a semiconductor region and a first conductor region and a second conductor region arranged at two sides of the semiconductor region respectively, the semiconductor region and the first conductor region being connected to the light-shielding layer, each of the first conductor region and the second conductor region being acquired by subjecting a semiconductor to conductive treatment, the light-shielding layer having a resistance smaller than the first conductor region;
   forming the interlayer dielectric layer on the base substrate with the gate electrode; and
   forming the source electrode and the drain electrode on the interlayer dielectric layer, the source electrode being connected to the first conductor region and the light-shielding layer, and the drain electrode being connected to the second conductor region.

10. The method according to claim 9, wherein the step of forming the active layer, the gate insulation layer and the gate electrode on the buffer layer and the light-shielding layer comprises:
- forming a semiconductor pattern on the buffer layer and the light-shielding layer;
- forming a gate insulation material layer and a gate metal layer sequentially on the base substrate with the semiconductor pattern;
- forming a first photoresist pattern on the gate metal layer;
- etching the gate metal layer and the gate insulation material layer through the first photoresist pattern to acquire the gate electrode and the gate insulation layer, the orthogonal projection of the gate electrode onto the base substrate overlapping an orthogonal projection of the light-shielding layer onto the base substrate;
- subjecting two end portions of the semiconductor patterns to conductive treatment to acquire the active layer; and
- removing the first photoresist pattern.

11. The method according to claim 9, wherein the step of forming the interlayer dielectric layer on the base substrate with the gate electrode comprises:
- forming a dielectric material layer on the base substrate with the gate electrode; and
- forming a first via-hole and a second via-hole in the dielectric material layer to acquire the interlayer dielectric layer,
- wherein the source electrode is connected to the light-shielding layer and the first conductor region through the first via-hole;
- a lower part of the first via-hole is defined by the light-shielding layer and the first conductor region; and
- the drain electrode is connected to the second conductor region through the second via-hole.

12. The method according to claim 9, wherein the step of forming the light-shielding layer and the buffer layer on the base substrate comprises:
- forming a first light-shielding conductive material layer on the base substrate;
- forming a second photoresist pattern on the base substrate with the first light-shielding conductive material layer;
- subjecting a first region of the first light-shielding conductive material layer not covered by the second photoresist pattern to oxidation treatment through the second photoresist pattern to acquire a buffer material layer and a second light-shielding conductive material layer, the buffer material layer comprising a first portion of the first region that has been oxidized, the second light-shielding conductive material layer comprising a second portion of the first region that has not been oxidized and a second region of the first light-shielding conductive material layer covered by the second photoresist pattern, the first portion covering the second portion, and the second portion being connected to the second region;
- removing the second photoresist pattern;
- forming a third photoresist pattern on the buffer material layer and the second light-shielding conductive material layer;
- etching the buffer material layer through the third photoresist pattern to acquire the buffer layer, the buffer layer being further provided with a second protrusion, a distance between the base substrate and a surface of the second protrusion away from the base substrate being equal to a distance between the base substrate and a surface of the first protrusion away from the base substrate, the drain electrode being connected to a portion of the second conductor region on the second protrusion;
- etching the second region of the second light-shielding conductive material layer through the third photoresist pattern to acquire the light-shielding layer, the light-shielding layer comprising a first thickness region, a second thickness region and a third thickness region arranged sequentially in a descending order of thicknesses, a distance between the base substrate and a surface of the first thickness region away from the base substrate being equal to the distance between the base substrate and the surface of the first protrusion away from the base substrate, the source electrode being connected to the first thickness region; and
- removing the third photoresist pattern.

13. The method according to claim 8, further comprising:
- forming a switching TFT on the base substrate; and
- forming an organic light-emitting diode (OLED) on the driving TFT,
- wherein the driving TFT is connected to the OLED and the switching TFT, and the OLED is capable of emitting a light beam toward the base substrate.

* * * * *